United States Patent [19]
Hughes

[11] Patent Number: 4,987,379
[45] Date of Patent: Jan. 22, 1991

[54] OPERATIONAL AMPLIFIER CIRCUIT
[75] Inventor: John B. Hughes, Hove, England
[73] Assignee: U.S. Philips Corporation, New York, N.Y.
[21] Appl. No.: 398,017
[22] Filed: Aug. 24, 1989
[30] Foreign Application Priority Data
 Sep. 5, 1988 [GB] United Kingdom ............... 8820836
[51] Int. Cl.$^5$ .............................................. H03F 3/45
[52] U.S. Cl. ................................. 330/253; 323/313; 330/257; 330/259
[58] Field of Search ............... 330/253, 257, 259, 261; 323/313, 314

[56] References Cited
U.S. PATENT DOCUMENTS
 4,092,611 5/1978 Frederiksen et al. ............... 330/261
 4,287,439 9/1981 Leuschner ....................... 323/313 X FOREIGN PATENT DOCUMENTS
 070609 4/1983 Japan .................... 330/257

Primary Examiner—James B. Mullins
Attorney, Agent, or Firm—Bernard Franzblau

[57] ABSTRACT

An operational amplifier circuit comprises a differential input stage (22) and an output transistor (N3) driven by an output (24) of the differential input stage. Means (N4, P3, P5) for generating a bias current for the differential input stage are constructed so that in operation the bias current is in a predetermined proportion to the current flowing in the output transistor (N3) and is substantially independent of the impedance (Z) of any load driven by the output transistor, thereby eliminating a systematic offset error. The means for generating the bias current may include a further transistor (N4) driven by the output of the differential input stage.

23 Claims, 3 Drawing Sheets

OPERATIONAL AMPLIFIER CIRCUIT

BACKGROUND OF THE INVENTION

This invention relates to an operational amplifier circuit comprising:

matched transistors forming a differential pair arrangement having a common terminal, first and second control terminals forming inputs of the amplifier and first and second output terminals;

a bias current source having an output connected to the common terminal of the differential pair arrangement;

a current mirror active load circuit having an input transistor and an output transistor connected to receive current from the first and second output terminals of the differential pair arrangement, respectively; and at least one output transistor having a control electrode connected to the second output terminal of the differential pair arrangement, the said output transistor being arranged to supply an output current of the amplifier to a load.

Such operational amplifier circuits are well known, for example, from U.S. Pat. No. 4 287 439, and are frequently found as part of an integrated circuit in bipolar or CMOS technology, for example. The differential pair arrangement typically comprises just two matched transistors in a "long-tailed pair" configuration, but may be enhanced by the provision of further transistors, for example, in Darlington or cascode configurations. As in all differential circuits, offset errors can arise because of a random mismatch between devices. Random errors can be minimized by layout and process improvements, as is well known in the art. There are also, however, predictable or systematic offset errors, dependent on the circuit design. It is known that by suitable design and scaling of the geometries of the various devices of the amplifier, systematic offset can be compensated in certain circumstances by subtracting from the current flowing through the output transistor a bias current related to the bias current generated for the input stage.

However, the compensation of systematic offset remains accurate only on condition that no further load is driven by the output transistor. In other words, the amplifier has a high-impedance voltage output only. To drive low-impedance loads it has been necessary to add a further output stage, which not only adds to the component count and increases power dissipation, but also introduces a systematic offset error of its own. An example of an application in which this error is a problem is in the field of bandgap voltage reference circuits such as that described in U.S. Pat. No. 4 287 439.

SUMMARY OF THE INVENTION

It is an object of the invention to provide a simple operational amplifier circuit capable of driving a relatively low impedance load with reduced systematic offset errors.

It is also an object of the invention to provide a simple but relatively accurate bandgap voltage reference circuit.

The invention provides an operational amplifier circuit as set forth in the opening paragraph, characterized in that the bias current source comprises means for supplying a bias current of predetermined proportion relative to the current flowing in the at least one output transistor so as to minimize a systematic offset voltage between the first and second output terminals of the differential pair arrangement, particularly when the output current forms all or a substantial part of the current flowing in the at least one output transistor. The invention is based on the recognition that in the known circuits systematic offset errors are compensated because of a relationship between the bias current and the current in the output transistor. This relationship in known circuits is destroyed by the connection of a low-impedance load to the output of the amplifier.

In one embodiment, at least one output transistor is matched or similar to the transistors of the current mirror circuit and the bias current source includes a further transistor also having a control electrode connected to the second output terminal of the differential pair arrangement and also being matched or similar to the transistors of the current mirror active load circuit. The further transistor serves to relieve the output transistor of the function of regulating the bias current, which function is thus performed independently of the load impedance.

The bias current source may further comprise a further current mirror circuit of opposite conductivity type to the current mirror active load circuit, having an input transistor driven by the further transistor and an output transistor arranged to drive the output of the bias current source. This provides a simple embodiment, in which the predetermined proportion can be defined accurately by selecting the relative dimensions of the further transistor and the output transistor and by selecting the scaling ratio of the further current mirror circuit.

When power is first applied to the circuit, it is possible that in certain embodiments of the circuit as described so far that it may become latched-up in stable states which are not the desired operating state. For example, in an embodiment constructed in MOS technology, the circuit may be stable when the transistors are in the sub-threshold region of their characteristic, creating a low-current latch-up condition. Therefore, the operational amplifier circuit may comprise start-up means connected in parallel with the output of the bias current source for providing a minimum bias current to avert a low-current latch-up condition.

In a simple embodiment, the start-up means may comprise a resistor of high enough value that the minimum current is small compared with expected values of the bias current. Alternatively, in an embodiment where the above-mentioned further transistor is provided as a part of the bias current source, the circuit may further comprise means for supplying a current proportional to the minimum bias current to the said further transistor so as to maintain the said predetermined proportion relating the bias current to the current in the at least one output transistor. This has the advantage that the minimum bias current need not be made negligibly small since it does not cause an error in the offset compensation Similarly, the operational amplifier circuit may comprise means for preventing a high-current latch-up condition. The means for preventing a high-current latch-up condition may comprise a resistor connected in series with the output of the bias current source so as to cause a voltage drop large enough to shut off the bias current generating means before the high current latch-up condition is reached.

In an embodiment constructed in MOS technology, the last-mentioned resistor may serve to drive an output transistor of the bias current source into the linear region of its operating characteristic before the high-current latch-up condition is reached.

The operational amplifier circuit in accordance with the invention is generally applicable and one or more may be provided as part of a larger circuit. For example, the invention further provides a bandgap reference circuit including an operational amplifier circuit as set forth above. The operational amplifier in such a circuit may include two output transistors, the two output transistors being arranged to control currents flowing through two semiconductor devices of differing dimensions. The use of the invention allows the output transistors to drive the semiconductor devices directly, rather than via a buffer stage, and substantially reduces errors in the reference circuit.

BRIEF DESCRIPTION OF THE DRAWINGS

Embodiments of the invention will now be described, by way of example, with reference to the accompanying drawings, in which.

DESCRIPTION OF THE PREFERRED EMBODIMENT

Figure 1:
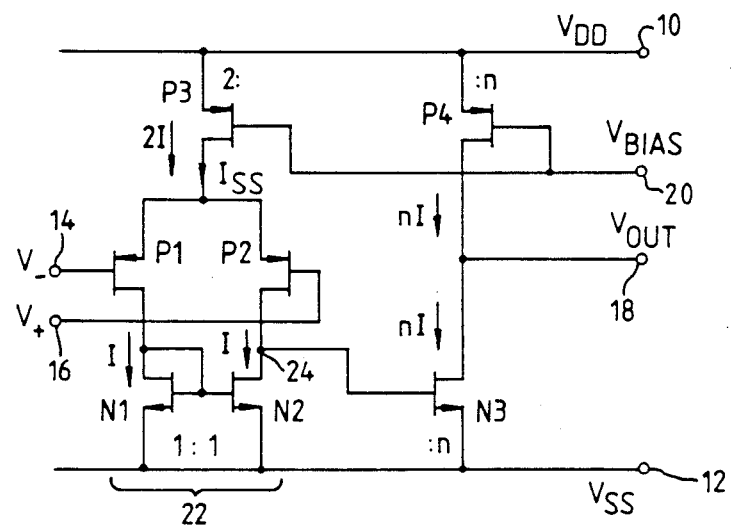
FIG. 1 shows a known operational amplifier circuit.

FIG. 1 shows a well-known simple operational amplifier circuit constructed, by way of example only, in CMOS technology. Analogous circuits are commonly constructed using bipolar technology. The circuit has supply terminals 10 ($V_{DD}$) and 12 ($V_{SS}$), a differential pair of inputs 14 ($V_-$) and 16 ($V_+$), an output 18 ($V_{OUT}$) and a bias input 20 ($V_{BIAS}$).

A differential input stage 22 comprises a long-tailed pair arrangement comprising two matched p-channel transistors P1 and P2, whose gates form the inputs 14 ($V_-$) and 16 ($V_+$), respectively, of the amplifier. The drains of transistors P1 and P2 form first and second output terminals of the long-tailed pair arrangement and are connected to the input and output respectively of a current mirror circuit comprising two n-channel transistors N1 and N2. The drain and gate of transistor N1 are connected together so that the transistor operates as a diode. The junction between the drains of the transistors P2 and N2 forms an output 24 of the input stage 22, and is connected to the gate of an n-channel output transistor N3.

A p-channel transistor P3 is connected between supply terminal 10($V_{DD}$) and the common terminal of the pair arrangement, formed by the sources of the transistors P1 and P2, and has its gate connected to the bias input 20. A further p-channel transistor P4 is connected between terminal 10 ($V_{DD}$) and the output 18 (that is, the drain of transistor N3). The gate of transistor P4 is also connected to the bias input 20.

In operation, the transistor P3 generates a bias current $I_{SS}$ or the differential input stage 22, the bias or "tail" current $I_{SS}$ being defined by a bias voltage $V_{BIAS}$ applied by a reference source (not shown) to the bias input 20. The transistor P4 provides a bias current for the output transistor N3 which is proportional to the bias current $I_{SS}$.

It is known that by suitable scaling of the geometries of the various transistors, which are integrated on a common substrate, the relative values of the various currents in the circuit can be defined so as to minimise systematic offset error. In CMOS circuits, it is well known in the art that the geometry of a transistor can be described in terms of aspect ratios W/L, where W is the channel width and L is the channel length, both being expressed in microns, for example. Scaling can also be achieved in bipolar transistors by providing different sized emitter junctions, as is also well known.

In the circuit of FIG. 1, the aspect ratios $(W/L)_{N1}$ etc., of the various transistors N1 etc., are scaled in accordance with Formula (1) below.

$$\frac{2(W/L)_{P4}}{(W/L)_{P3}} = \frac{(W/L)_{N3}}{(W/L)_{N1}} = \frac{(W/L)_{N3}}{(W/L)_{N2}} = n \quad (1)$$

The value of n is a constant chosen to suit the output requirements of the circuit. The currents flowing in the circuit with zero differential input (i.e. when $V_+ = V_-$) are indicated in FIG. 1 in terms of a unit current I. In general, the scaling defined in Formula (1) ensures that $$I_{N3}:I_{N1} = I_{N3}:I_{N2} = n \text{ and } I_{P4}:I_{P3} = n/2.$$

Figure 2:
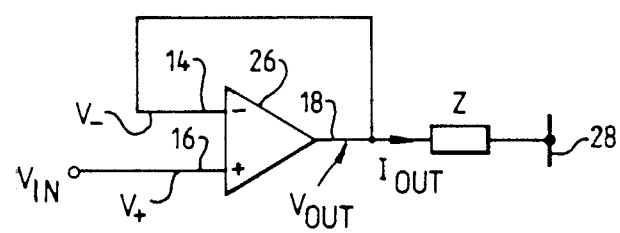
FIG. 2 shows an operational amplifier in a known feedback circuit, for illustration of the principle of the invention.

In order to understand the problem of systematic offset error it is helpful to consider the operational amplifier as it will be used, in the context of a negative feedback circuit. FIG. 2 shows a very simple feedback arrangement implementing a unity-gain voltage follower. In FIG. 2, an operational amplifier 26 has an inverting input 14, a non-inverting input 16 and an output 18. These reference signs correspond to those used in FIG. 1 so that the known operational amplifier of FIG. 1 can be visualised in the circuit of FIG. 2. The output 18 is connected directly to the inverting input 14 to provide 100 per cent negative feedback ($V_- = V_{OUT}$). A load of impedance Z is connected between the output 18 and a supply 28 ($V_{SS}, V_{DD}$ or ground, for example).

With an ideal operational amplifier 26, the feedback to input 14 ensures that $V_{OUT}$ follows exactly the voltage $V_{IN}$ applied to the input 16, that is $V_{OUT} = V_{IN}$.

Otherwise, an offset error appears: $V_{OUT} = V_{IN} + V_{OFFSET}$. In an operational amplifier such as that shown in FIG. 1, this ideal behaviour depends on there being absolutely symmetrical conditions in the two sides of the differential stage 22 so that $V_+ = V_-$. This requires not only that the currents in the transistors P1 and P2 to be equal, but also their drain voltages.

It can be seen from FIG. 1 that the voltage on the gate of the output transistor N3 is equal to the drain voltage on transistor N2 (node 24). The gate voltage of transistor N2 is equal to the gate and drain voltages of transistor N1. So long as $IN_1 + IN_2 = 2.I_{N3}/n$, then the transistor scaling as defined above and the feedback from output 18 to input 14 dictates that at equilibrium the gate of transistor N3 must be at the same level as the gate of transistor N2. This in turn means that the drain voltages of transistors N1 and N2 are also equal (and hence P1 and P2), as well as the currents $I_{N1}$ and $I_{N2}$. Therefore, at equilibrium the circuit is symmetrical and there is no systematic offset error in the output. Any mismatch between devices will still of course introduce asymmetry, giving rise to a random offset error.

This ideal situation only holds, however, when the load impedance Z connected to output 18 is a capacitance or a high resistance. If Z were a lower impedance load, then a net current $I_{OUT}$ can flow through the output 18, destroying the proportionality between the currents $(I_{N1}+I_{N2})$ and $I_{N3}$, and so destroying the offset compensation.

A known solution to this problem is to provide a low-output impedance buffer stage to drive low impedance loads such as the arbitrary impedance Z. Such an output buffer may, for example, comprise a single transistor in a source follower (or emitter follower) configuration, or may comprise a push-pull output stage. However, such a buffer stage increases dissipation and introduces a systematic offset error of its own.

Figure 3:
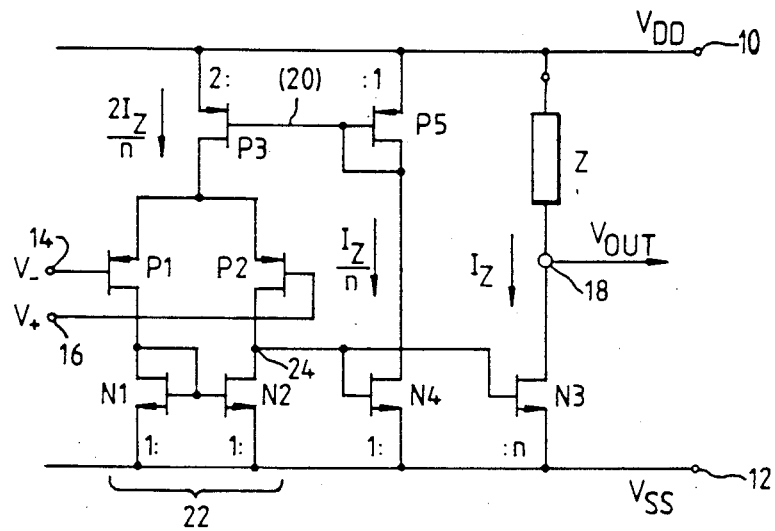
FIG. 3 shows an operational amplifier in accordance with the present invention.

FIG. 3 shows an operational amplifier constructed in accordance with the present invention for an arbitrarily low impedance Z. The circuit of FIG. 3 is a modified version of the circuit of FIG. 1 and corresponding reference labels are used for parts having the same function.

The circuit includes a further n-channel output transistor N4 having its gate connected to the output 24 of the differential input stage 22. The output transistors N3 and N4 thus have the same gate-source voltage at all times. The drain of the further output transistor N4 is connected to supply terminal 10 ($V_{DD}$) via a diode-connected p-channel transistor P5. The gate-drain connection of transistor P5 is connected to the gate of transistor P3 and thus replaces the bias input 20.

In operation, the p-channel transistors P5 and P3 act as a current mirror circuit whose output current is the bias current for the differential input stage 22. The bias current in FIG. 3 is not a predetermined constant however. The bias current is varied by the feedback arrangement N4,P5,P3 so as to be proportional at all times to the current in the output transistor N3. This enables systematic offset error to be compensated even though the impedance Z has a low value.

The compensation may now be achieved as before by scaling the relative dimensions of the various transistors. The aspect ratios for the new transistors N4 and P5 are defined so that $(W/L)_{N4}=(W/L)_{N1}=(W/L)_{N2}$ and
$2.(W/L)_{P5}=(W/L)_{P3}$.

Considering now the operational amplifier of FIG. 3 substituted for the known amplifier of FIG. 1 in the voltage follower circuit of FIG. 2, described above, it can be seen that this scaling achieves the condition for zero systematic offset, namely $(I_{N1}+I_{N2})=2.I_{N3}/n$, but irrespective of any output current $I_Z$ and hence independently of the value of the load impedance Z.

Figure 6:
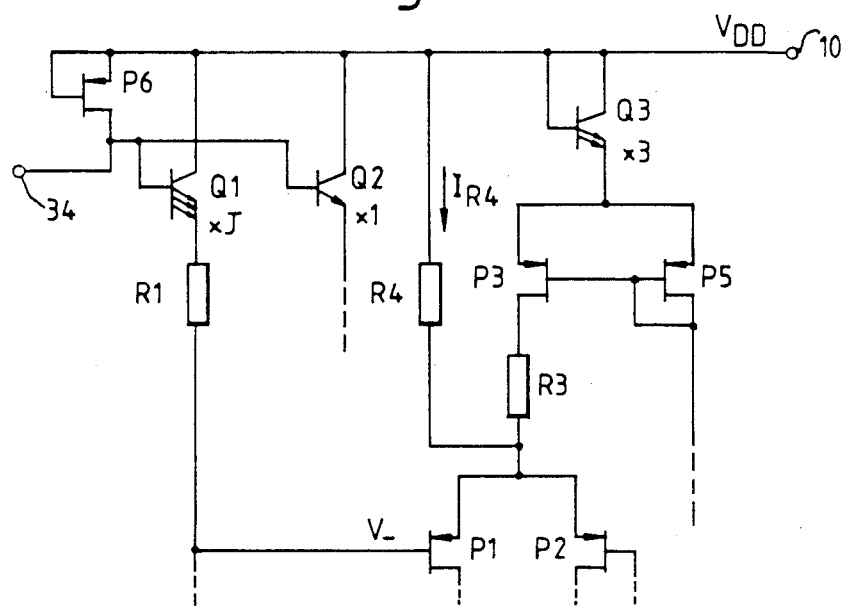
FIG. 6 shows a part of the circuit of FIG. 5 modified to prevent latch-up in undesired states.

It should be noted that because of the feedback process by which the bias currents are defined in the circuit of FIG. 3, the circuit is stable not only in the desired state (where all transistors are biased in the saturated region of their operating characteristic) but also in the state where all currents are zero and in a high-current state and a low-current state in the sub-threshold region. Therefore, it is possible, under certain conditions, that the novel circuit could latch-up in undesired states. A first modification of the circuit around transistors P3 and P5 which avoids this problem is shown in FIG. 6, to be described hereinafter. A second such modification, shown dotted in FIG. 3, will also be described hereinafter.

Figure 4:
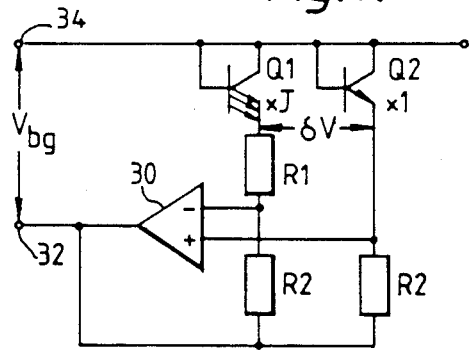
FIG. 4 illustrates the principle of a bandgap reference circuit.

FIG. 4 shows the circuit of a bandgap reference voltage generator. The circuit is formed around two diode-connected bipolar transistors Q1 and Q2. The transistors Q1 and Q2 are similar but scaled so that the effective emitter area of transistor Q1 is a factor J larger than that of transistor Q2. The emitter of transistor Q1 is connected via a resistance R1 to the inverting input of an operational amplifier (op-amp) 30, and the emitter of transistor Q2 is connected directly to the non-inverting input of the op-amp 30. The output of the op-amp 30 is fed back to both inputs via a pair of equal resistors R2.

In operation, the currents in the transistors Q1 and Q2 increase until the voltage across resistance R1 exactly equals the difference $\delta V$ between the base-emitter voltages of the transistors Q1 and Q2. In accordance with the theory of bandgap reference circuits, it is known that $\delta V=(kT/q).\ln J$, where k is Boltzmann's constant $(1.38\times10^{-23} JK^{-1})$, $\delta T$ is the absolute temperature (in kelvin), q is the electron charge $(1.6\times10^{-19}C)$ and $\ln J$ is the natural logarithm of the factor J. By suitable choice of the ratio R1:R2, the circuit generates a stable and accurately defined bandgap reference voltage $V_{bg}$ between an output 32 connected to the output of the op-amp 30 and an output 34 connected to the common base connection of the transistors Q1 and Q2.

In designing an op-amp suitable for use in such a circuit, it must be considered that the load to be driven is of relatively low impedance, being approximately $(R1+R2+r_e)/2$ where $r_e$ is the emitter resistance of transistors Q1 and Q2. It has been necessary previously to provide an op-amp with an additional output buffer stage to obtain the required current driving capability, which introduces systematic offset errors and therefore reduces the accuracy of the reference voltage $V_{bg}$.

Figure 5:
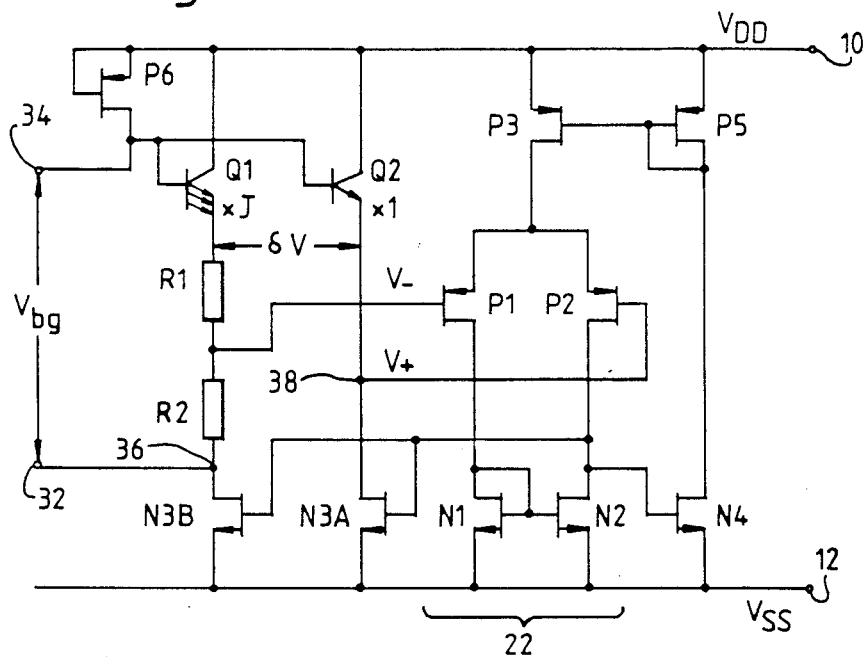
FIG. 5 shows the operational amplifier of FIG. 3 incorporated in a bandgap reference circuit.

FIG. 5 shows the operational amplifier of FIG. 3 incorporated in a band gap reference circuit analogous to that shown in FIG. 4. The reference signs in FIG. 5 correspond largely with those of the earlier figures so that the circuit requires little description beyond a few points of difference.

The differential input stage 22 of the op-amp in FIG. 5 drives two identical output transistors N3A and N3B in place of the single output transistor N3 and in addition to the further transistor N4. This provides two current outputs 36 and 38 by means of which the op-amp 30 biases the bipolar transistors Q1 and Q2, respectively. The second resistance R2 in series with transistor Q2 is no longer necessary since the currents in the two outputs 36 and 38 are constrained to be equal by the matching of the output transistors N3A and N3B.

A diode-connected p-channel transistor P6 is inserted between the supply terminal 10 ($V_{DD}$) and the bases of the bipolar transistors Q1 and Q2. This is done solely for the purpose of providing enough "headroom" between the emitter voltages of those transistors Q1 and Q2 and $V_{DD}$ to allow the transistors P1,P2,P3 of the op-amp to be biased into saturation. Transistor P6 could be replaced by two or more such transistors in series if even more headroom is required.

As has been mentioned with reference to FIG. 3, the novel operational amplifier circuit described so far (not including the part shown dotted in FIG. 3) can under certain conditions latch up in undesired states. FIG. 6 shows a part of the circuit of FIG. 5 modified to avoid latch-up in these undesired states. The modification affects only the bias current generating current mirror arrangement P3,P5. In the modified circuit of FIG. 6, instead of being connected directly to the supply terminal 10, the sources of the transistors P3 and P5 are connected to the terminal 10 ($V_{DD}$) via a diode-connected n-p n transistor Q3. The sources of the matched p channel transistors P1 and P2 are connected to the drain of transistor P3 via a resistance R3, rather than directly as in FIG. 5. A further resistance R4 is connected in parallel with the series chain R3, P3, Q3 between the supply terminal 10 ($V_{DD}$) and the junction of the sources of transistors P1 and P2.

When power is first applied across the terminals 10 and 12, the resistor R4 provides a starting current $I_{R4}$ which is above the sub-threshold latching state. However, resistor R4 is made large enough that this starting current $I_{R4}$ is small compared with the normal bias current through transistor P3 and therefore does not introduce a significant offset error. The resistor R3 generates a voltage drop proportional to the bias current flowing through transistor P3. The value of resistor R3 is chosen to be relatively small so that transistor P3 is not prevented from saturating under normal conditions, but the voltage drop is large enough to drive transistor P3 into the linear region before it reaches its high-current latch-up condition. The transistor Q3 can be shown to pass a current three times that through the second junction device Q2. If the transistor Q3 is given an effective emitter area of 3, it serves to compensate the latch-up preventing mechanism against variations in $V_{BE}$ (which affect $V_+$ and $V_-$). In this way the latch-up preventing mechanism can be made to have minimal adverse side effects over a wide range of temperature.

An alternative start-up arrangement is shown dotted in FIG. 3. An n-channel transistor N5 acts as a permanently-on current source and supplies a current $I_a$ to a diode connected transistor P6 which forms the input transistor of a p-channel current mirror having two output transistors P7 and P8. The aspect ratios of the transistors P6,P7 and P8 are in the ratio 1:2:1. A current $2I_a$ produced by transistor P7 is added to the bias current generated by transistor P3 so as to constitute a minimum bias current for the differential pair P1,P2. A current $I_a$ produced by transistor P8 is supplied to the drain of the transistor N4.

This alternative arrangement avoids the need for the starting current $2I_a$ to be negligibly small, because although the bias current $2I_Z/n$ is now $2I_a$ less than the current in the biasing transistor P3, the current in the transistor P5 is $I_a$ less than that in the transistor N4, so that proportionally is restored. The arrangement does impose a minimum value $nI_a$ on the output current $I_Z$, but, providing that this is chosen to be below the range of values that $I_Z$ may take in operation, the operation of the circuit is unaffected. Other start-up arrangements are also possible wherein the source of the minimum current is actively shut off once the correct operating point is reached.

It will be appreciated that whereas the embodiments described herein contain MOS transistors of particular conductivity types, the inventive principle can equally be applied to circuits in which devices have the opposite conductivity type and signals have the opposite polarity, and to circuits using bipolar devices. It will also be appreciated that within the constraints defined herein, the scaling of the various transistors can be varied freely to suit particular input and/or output requirements.

From reading the present disclosure, other modifications will be apparent to persons skilled in the art. Such modifications may involve other features which are already known in the design, manufacture and application of operational amplifier circuits, bandgap reference circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

I claim:

1. An operational amplifier circuit comprising:
matched transistors connected in a differential pair arrangement having a common terminal, first and second control terminals forming inputs of the amplifier and first and second output terminals;
a bias current source having an output connected to the common terminal of the differential pair arrangement;
a current mirror active load circuit having an input transistor and an output transistor connected to receive current from the first and second output terminals of the differential pair arrangement respectively; and
at least one output transistor having a control electrode connected to the second output terminal of the differential pair arrangement, said output transistor being connected to supply an output current of the amplifier to a load;
wherein the bias current source comprises means for supplying a bias current of predetermined proportion relative to the current flowing in the at least one output transistor so as to maintain equal voltages at said first and second output terminals for equal voltages applied to the first and second control terminals thereby to minimize a systematic offset voltage between the first and second output terminals of the differential pair arrangement when said output current forms all or a substantial part of the current flowing in the at least one output transistor.

2. An operational amplifier circuit as claimed in claim 1 wherein at least the one output transistor is matched or similar to the transistors of the current mirror active load circuit and the bias current source includes a further transistor having a control electrode connected to the second output terminal of the differential pair arrangement and also being matched or similar to the transistors of the current mirror active load circuit.

3. An operational amplifier circuit as claimed in claim 2 wherein the bias current source further comprises a further current mirror circuit of opposite conductivity type to the current mirror active load circuit and having an input transistor driven by the further transistor and an output transistor connected to drive the output of the bias current source.

4. An operational amplifier circuit as claimed in claim 3 comprising start-up means connected in parallel with the bias current source for providing a minimum bias current to avert a low-current latch-up condition.

5. An operational amplifier circuit as claimed in claim 3 comprising means for preventing a high-current latch-up condition, said latch-up preventing means comprising a resistance connected in series with the output of the bias current source so as to cause a voltage drop large enough to shut-off the output transistor of the further current mirror before the high current latch-up condition is reached.

6. An operational amplifier circuit as claimed in claim 2 comprising start-up means connected in parallel with the bias current source for providing a minimum bias current to avert a low-current latch-up condition.

7. An operational amplifier circuit as claimed in claim 6 wherein the start-up means comprise a resistance of high enough value that the minimum current is small compared with the bias current.

8. An operational amplifier circuit as claimed in claim 1 comprising start-up means connected in parallel with the bias current source for providing a minimum bias current to avert a low-current latch-up condition.

9. An operational amplifier circuit as claimed in claim 8 wherein the start-up means comprise a resistance of high enough value that the minimum current is small compared with the bias current.

10. An operational amplifier circuit as claimed in claim 8 comprising means for preventing a high-current latch-up condition.

11. An operational amplifier circuit as claimed in claim 1 comprising means for preventing a high-current latch-up condition.

12. A bandgap reference circuit comprising; an operational amplifier circuit as claimed in claim 1, third and fourth transistors coupled between a source of operating voltage and said first and second control terminals, respectively, and a feedback circuit coupled between said second output terminal of the differential pair arrangement and one of said first and second control terminals.

13. A bandgap reference circuit comprising; an operational amplifier circuit comprising:
first and second matched transistors connected in a differential pair arrangement having a common terminal, first and second control terminals forming inputs of the amplifier and first and second output terminals;
a bias current source having an output connected to the common terminal of the differential pair arrangement;
a current mirror active load circuit having an input transistor and an output transistor connected to receive current from the first and second output terminals of the differential pair arrangement respectively; and
two matched or similar output transistors having control electrodes connected to the second output terminal of the differential pair arrangement,
said bandgap reference circuit further comprising two semiconductor junction devices of different dimensions coupled to said two output transistors which transistors control currents flowing through the two semiconductor junction devices; and wherein the bias current source comprises means for supplying a bias current of predetermined proportion relative to the currents flowing in the two output transistors so as to minimize a systematic offset voltage between the first and second output terminals of the differential pair arrangement when said controlled currents form all or a substantial part of the currents flowing in the two output transistors.

14. A bandgap reference circuit as claimed in claim 13 wherein the two output transistors are matched or similar to the transistors of the current mirror active load circuit and the bias current source includes a further transistor having a control electrode connected to the second output terminal of the differential pair arrangement and also being matched or similar to the transistors of the current mirror active load circuit.

15. A bandgap reference circuit as claimed in claim 14 wherein the bias current source further comprises a further current mirror circuit of opposite conductivity type to the current mirror active load circuit and having an input transistor driven by the further transistor and an output transistor connected to drive the output of the bias current source.

16. A bandgap reference circuit as claimed in claim 14 wherein the operational amplifier circuit comprises start-up means connected in parallel with the bias current source for supplying a minimum bias current to the common terminal of the differential pair arrangement.

17. A bandgap reference circuit as claimed in claim 13 wherein the operational amplifier circuit comprises start-up means connected in parallel with the bias current source for providing a minimum bias current to avert a low-current latch-up condition.

18. A bandgap reference circuit as claimed in claim 17 wherein the start-up means comprise a resistance of high enough value that the minimum current si small compared with the bias current.

19. A bandgap reference circuit as claimed in claim 13 wherein the operational amplifier circuit comprises means for preventing a high-current latch-up condition.

20. A bandgap reference circuit as claimed in claim 19 wherein the means for preventing the high-current latch-up condition comprises a resistance connected in series with the output of the bias current source so as to cause a voltage drop large enough to shut-off the bias current source before the high current latch-up condition is reached.

21. An operational amplifier circuit comprising;
first and second matched transistors connected as a differential pair arrangement having a common terminal, first and second control terminals and first and second output terminals,
a source of bias current having an output connected to the common terminal of the differential pair arrangement,
a current mirror active load circuit having an input transistor and an output transistor connected to receive current from the first and second output terminals of the differential pair arrangement, respectively,
first and second signal input terminals coupled to said first and second control terminals, respectively, and isolated from said second output terminal so that there is no feedback between said second output terminal and said first and second control terminals, and
an output transistor having a control electrode connected to the second output terminal of the differential pair arrangement, said output transistor being connected to supply an output current of the amplifier to a load,
wherein the bias current source comprises means for supplying a bias current of predetermined proportion relative to the current flowing in the output transistor such that a voltage at said first output terminal is made equal to a voltage at said second output terminal of the differential pair arrangement whereby said output current of the amplifier is substantially independent of the load impedance.

22. An operational amplifier circuit as claimed in claim 21 wherein the output transistor is matched to the transistors of the current mirror active load circuit and the bias current source includes a further transistor having a control electrode connected to the second output terminal of the differential pair arrangement and matched to the transistors of the current mirror active load circuit.

23. An operational amplifier circuit as claimed in claim 22 wherein the bias current source includes a further current mirror circuit of opposite conductivity type to the current mirror active load circuit and having an input transistor driven by the further transistor and an output transistor connected to supply its current to the common terminal of the differential pair arrangement.

* * * * *